(12) United States Patent
Azuma

(10) Patent No.: US 7,880,237 B2
(45) Date of Patent: Feb. 1, 2011

(54) SEMICONDUCTOR DEVICE

(75) Inventor: Atsushi Azuma, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 344 days.

(21) Appl. No.: 12/189,439

(22) Filed: Aug. 11, 2008

(65) Prior Publication Data

US 2009/0140344 A1 Jun. 4, 2009

(30) Foreign Application Priority Data

Aug. 9, 2007 (JP) ............... 2007-207874

(51) Int. Cl.
*H01L 21/70* (2006.01)
(52) U.S. Cl. ..................... 257/368; 257/401
(58) Field of Classification Search ......... 257/368, 257/401
See application file for complete search history.

(56) References Cited

U.S. PATENT DOCUMENTS 5,619,055 A 4/1997 Meguro et al.

FOREIGN PATENT DOCUMENTS

JP 2004-342790 12/2004

*Primary Examiner*—Douglas M Menz
(74) *Attorney, Agent, or Firm*—Turocy & Watson, LLP

(57) ABSTRACT

A semiconductor device including a SRAM cell may include a data holding unit including a driver transistor and a load transistor, and receiving and holding data; and a data transferring unit including a transfer gate transistor whose source and drain are connected between the data holding unit and one of a pair of bit lines, and whose gate is connected to a word line, the data transferring unit either transferring the data transferred from the one of the pair of bit lines to the data holding unit or receiving the data held in the data holding unit and transferring the data to the one of the pair of bit lines, wherein at least one of the driver transistor and the load transistor has higher capacitance between the gate and the source and between the gate and the drain than the transfer gate transistor.

14 Claims, 11 Drawing Sheets

SEMICONDUCTOR DEVICE

CROSS REFERENCE TO RELATED APPLICATION

This application is based upon and claims the benefit of priority from Japanese Patent Application No. 2007-207874, filed on Aug. 9, 2007, the entire contents of which are incorporated herein by reference.

BACKGROUND

Recently, miniaturization in a static random access memory (SRAM) has enabled a high-speed operation at the GHz level of the SRAM. However, at the same time, such miniaturization has decreased internal capacitance in a flip-flop consisting of: a load transistor formed of a P-channel MOS transistor; and a driver transistor formed of an N-channel MOS transistor. Meanwhile, miniaturization in transistors has decreased a cell stability margin in direct-current levels, and these decreases eventually lead to decrease in an operation margin for high-frequency signals of a semiconductor device (refer to Japanese Patent Application Publication No.

SUMMARY

Aspects of the invention relate to an improved semiconductor device.

In one aspect of the present invention, a semiconductor device including a SRAM cell may include a data holding unit including a driver transistor and a load transistor, and receiving and holding data; and a data transferring unit including a transfer gate transistor whose source and drain are connected between the data holding unit and one of a pair of bit lines, and whose gate is connected to a word line, the data transferring unit either transferring the data transferred from the one of the pair of bit lines to the data holding unit or receiving the data held in the data holding unit and transferring the data to the one of the pair of bit lines, wherein at least one of the driver transistor and the load transistor has higher capacitance between the gate and the source and between the gate and the drain than the transfer gate transistor.

BRIEF DESCRIPTIONS OF THE DRAWINGS

A more complete appreciation of the invention and many of the attendant advantages thereof will be readily obtained as the same becomes better understood by reference to the following detailed description when considered in connection with the accompanying drawings.

DETAILED DESCRIPTION

Figure 1:
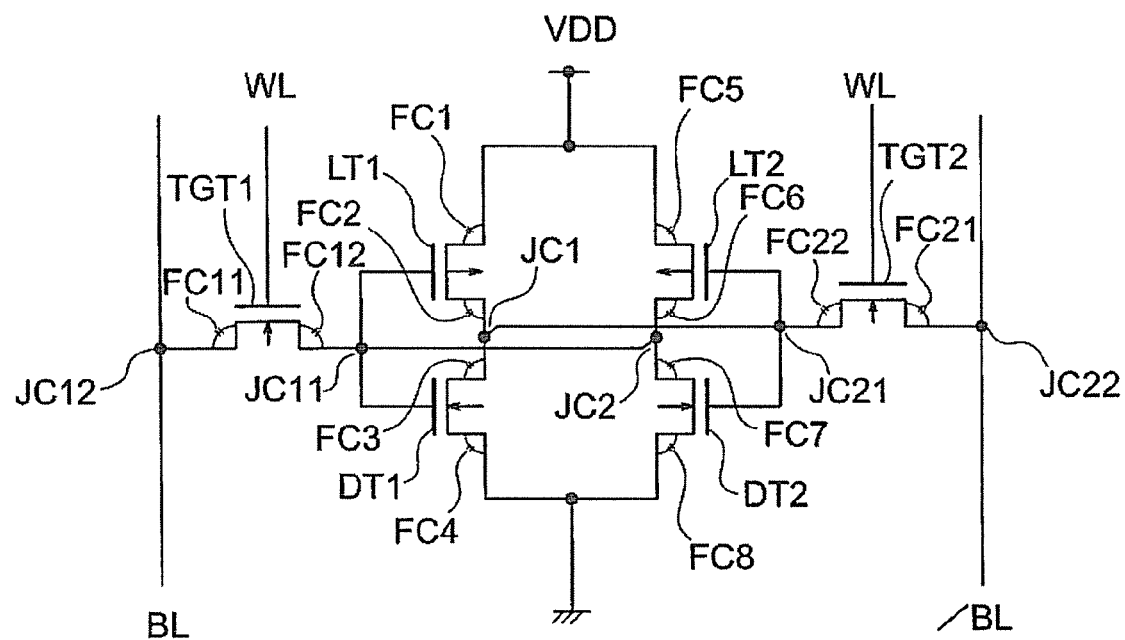
FIG. 1 shows a circuit configuration of an SRAM cell included in each semiconductor device of first to third embodiments.

Various connections between elements are hereinafter described. It is noted that these connections are illustrated in general and, unless specified otherwise, may be direct or indirect and that this specification is not intended to be limiting in this respect.

Embodiments of the present invention will be explained with reference to the drawings as next described, wherein like reference numerals designate identical or corresponding parts throughout the several views.

In order to balance the high speed performance and the stability of operation of a semiconductor device, it is necessary to decrease bit line capacitance, which critically affects the speed of the operation, while increasing internal capacitance in SRAM cells.

Examples of approaches for increasing internal capacitance in SRAM cells are as follows:

(1) increasing junction capacitance by increasing the concentration of its substrate; and (2) adding, to each SRAM cell, an external capacitor as used in a dynamic random access memory (DRAM).

However, the approach (1) causes problems such as unnecessarily increasing the thresholds in the SRAM cells and increasing junction leakage therein. Meanwhile, the approach (2) enables addition of high capacitance in the SRAM cells but causes significant increase in manufacturing cost due to the formation of the external capacitors. Hereinafter, description will be given of semiconductor devices according to embodiments of the present invention with reference to the drawings.

FIG. 1 shows a circuit configuration of an SRAM cell included in each semiconductor device of first to third embodiments to be described later. Between a power supply terminal VDD and a ground terminal VSS, the source and drain of a load transistor LT1 formed of a P-channel MOS transistor and the drain and source of a driver transistor DT1 formed of an N-channel MOS transistor are connected in series. In addition, in parallel with these, the source and drain of a load transistor LT2 and the drain and source of a driver transistor DT2 are also connected in series between the power supply terminal VDD and the ground terminal VSS.

Between a bit line BL and the gates of the transistors LT1 and DT1, the source and drain of a transfer gate transistor TGT1 formed of an N-channel MOS transistor are connected. Between a bit line/BL and the gates of the transistors LT2 and DT2, the source and drain of a transfer gate transistor TGT2 are connected. The gates of the transistors TGT1 and TGT2 are connected to word lines WL, respectively.

Here, the transistors LT1 and DT1 and the transistors LT2 and DT2 constitute a flip-flop. As internal capacitance, the SRAM cell has junction capacitance JC1 and JC2 and overlap capacitance FC1 to FC8. The junction capacitance JC1 exists at a junction point between the drains of the transistors LT1 and DT1 and the gates of the transistors LT2 and DT2, while the junction capacitance JC2 exists at a junction point between the drains of the transistors LT2 and DT2 and the gates of the transistors LT1 and DT1. The overlap capacitance FC1 to FC8 respectively exists between the drains (including their extensions) and gates of the transistors LT1, DT1, LT2 and DT2, and between the sources (including their extensions) and gates of these transistors. Here, overlap capacitance is the sum of fringe capacitance and capacitance between an extension and a gate.

On the other hand, in the transfer gate transistors TGT1 and TGT2, there are junction capacitance JC11, JC12, JC21 and JC22, and overlap capacitance FC12, FC11, FC22 and FC21. The junction capacitance JC11 and JC12 respectively exists at junction points to the drain and to the source of the transfer gate transistor TGT1, while the junction capacitance JC21 and JC22 respectively exists at junction points to the drain and to the source of the transfer gate transistor TGT2. The overlap capacitance FC12 exists between the gate and drain of the transistor TGT1, while the overlap capacitance FC11 exists between the gate and source of the transistor TGT1. The overlap capacitance FC22 exists between the gate and drain of the transistor TGT2, while the overlap capacitance FC21 exists between the gate and source of the transistor TGT2.

In this configuration, among the above internal capacitance in the SRAM cell, the overlap capacitance FC1 to FC8 is relatively increased while none of the junction capacitance JC1 and JC2 is increased. Moreover, in the transfer gate transistor, none of the junction capacitance JC11, JC12, JC21 and JC22, and the overlap capacitance FC11, FC12, FC21 and FC22 is increased. Hereinbelow, a configuration of the elements and a manufacturing method thereof will be specifically described as the first to third embodiments.

(1) First Embodiment

Figure 2A:
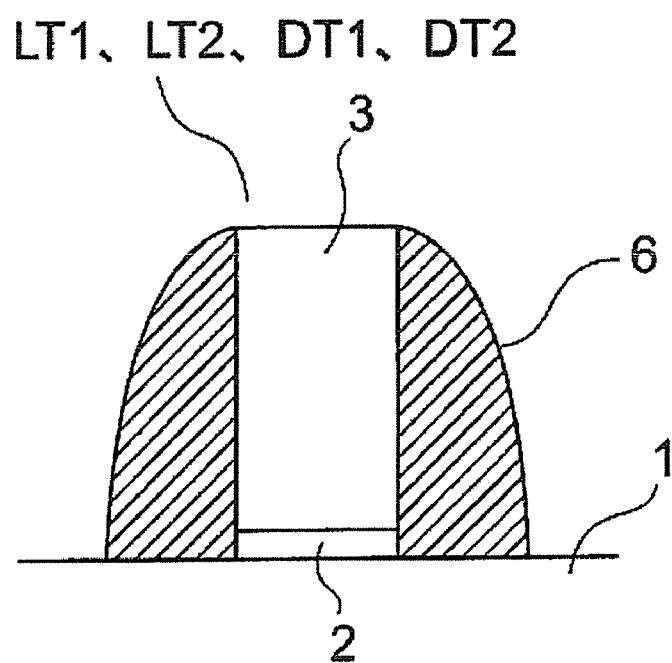
FIG. 2A shows a longitudinal section structure of each of the load transistors LT1 and LT2 and the driver transistors DT1 and DT2.
Figure 2B:
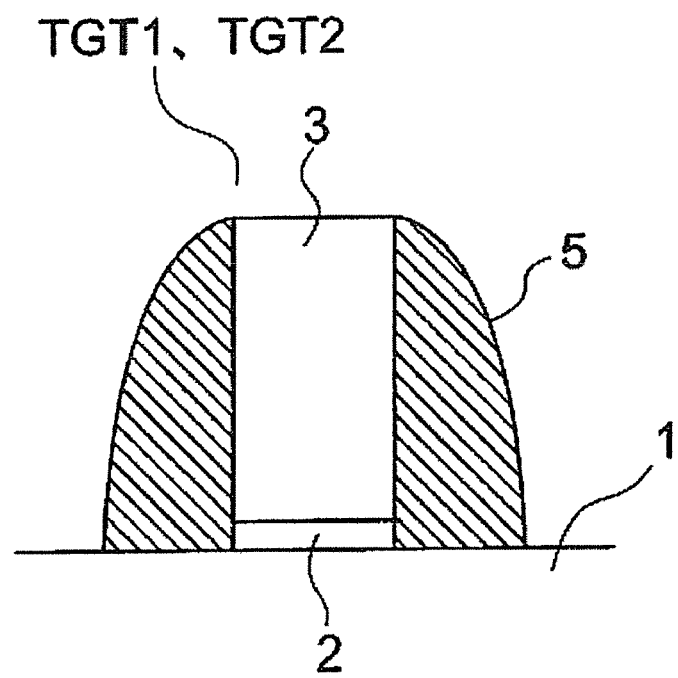
FIG. 2B shows a longitudinal section structure of each of the transfer gate transistors TGT1 and TGT2.

Among the transistors included in the SRAM cell shown in FIG. 1, FIG. 2A shows a longitudinal section structure of each of the load transistors LT1 and LT2 and the driver transistors DT1 and DT2, while FIG. 2B shows a longitudinal section structure of each of the transfer gate transistors TGT1 and TGT2.

In each of the load transistors LT1 and LT2 and the driver transistors DT1 and DT2, a gate insulating film 2 and a gate electrode 3 are formed on the upper surface of a semiconductor substrate 1, and sidewalls 6 of the gate electrode 3 are made of, for example, hafnium oxide (HfO2), which has a high dielectric constant of 24. The existence of the sidewalls 6 with a high dielectric constant increases the overlap capacitance between the gate electrode 3 and the source and between the gate electrode 3 and the drain.

Note, however, that the material used for the sidewalls 6 is not limited to hafnium oxide (HfO2), but may be other insulating material with a higher dielectric constant than that for the sidewalls used in the transfer gate transistor to be described later. Examples of such insulating material include: zirconium oxide (ZrO2) (dielectric constant=11 to 18.5), aluminum oxide (Al2O3) (dielectric constant=8.5 to 10) and titanium oxide (TiO2) (dielectric constant=50 to 110); silicates thereof; and ternary or higher compounds including these elements.

Moreover, the structure of each sidewall is not limited to a simple single-layer structure as shown in FIG. 2A, but may be a layered structure including a high dielectric material or be a structure including L-shaped sidewalls as in the third embodiment to be described later.

Meanwhile, in each of the transfer gate transistors TGT1 and TGT2, as shown in FIG. 2B, a gate insulating film 2 and a gate electrode 3 are formed on the upper surface of a semiconductor substrate 1. In addition, sidewalls 5 of the gate electrode 3 are made of a material with a lower dielectric constant than the sidewalls used in the driver transistors DT1 and DT2 and the load transistors LT1 and LT2. For example, silicon nitride (SiN), which has a low dielectric constant of approximately 7.9, is used for the sidewalls 5.

Figure 3:
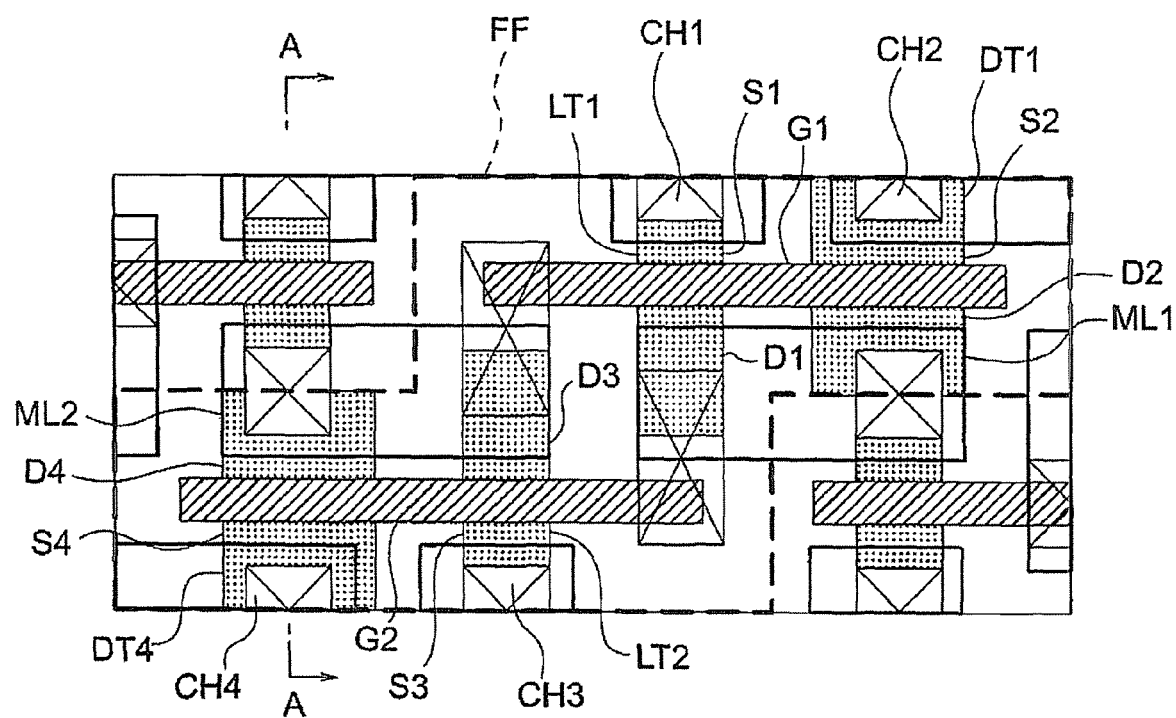
FIG. 3 is a plan view showing an example of a layout in the SRAM cell to be included in a semiconductor device according to the first embodiment.

FIG. 3 is a plan view showing an example of a layout in the SRAM cell to be included in a semiconductor device according to this first embodiment.

The flip-flop consisting of the load transistors LT1 and LT2 and the driver transistors DT1 and DT2 is disposed in the region FF enclosed by the bold dashed line. Specifically, the load transistor LT1 has a source region S1, a drain region D1 and a gate electrode G1, and the source region S1 is connected to a power supply terminal through a contact hole CH1. The driver transistor DT1 shares the gate electrode G1 and has a source region S2 and a drain region D2, and the source region S2 is connected to a ground terminal through a contact hole CH2. The load transistor LT2 has a source region S3, a drain region D3 and a gate electrode G2, and the source region S3 is connected to the power supply terminal through a contact hole CH3. The driver transistor DT2 shares the gate electrode G2 and has a source region S4 and a drain region D4, and the source region S4 is connected to the ground terminal through a contact hole CH4. The drain region D2 of the driver transistor DT1 is connected to a drain region of the unillustrated transfer gate transistor TGT1 through a metal interconnection layer ML1, and the drain region D4 of the driver transistor DT2 is connected to a drain region of the unillustrated transfer gate transistor TGT2 through a metal interconnection layer ML2.

Each of these transistors LT1, LT2, DT1 and DT2 in the region FF has sidewalls made of a material with a high dielectric constant as shown in FIG. 2A. This allows the semiconductor device of this first embodiment to have increased internal capacitance and to provide an operation stable to high-frequency signals without causing cost increase or threshold change. Moreover, since the transfer gate transistors TGT1 and TGT2 have sidewalls made of a material with a lower dielectric constant, the overlap capacitance therein is smaller than the overlap capacitance in the transistors LT1, LT2, DT1 and DT2. In addition, the junction capacitance in the transfer gate transistors TGT1 and TGT2 is not increased, either. Thus, problems such as increase in word line load capacitance or increase in junction leakage can be avoided.

Hereinafter, description will be given of a procedure of manufacturing the SRAM cell to be included in the semiconductor device according to this first embodiment. The cross-sectional views shown in FIGS. 4A to 5C each show a longitudinal section taken along the line A-A in FIG. 3. Here, in each of these drawings, the transistor in the left side is the driver transistor DT1 or DT2 configured of an N-channel MOS transistor, while the transistor in the right side is the transfer gate transistor TGT1 or TGT2 configured of an N-channel MOS transistor.

Note that the load transistor LD1 or LD2 configured of a P-channel MOS transistor is not shown since it has the same structure as the driver transistor DT1 or DT2 except for the conductivity types of the source and drain.

Figure 4A:
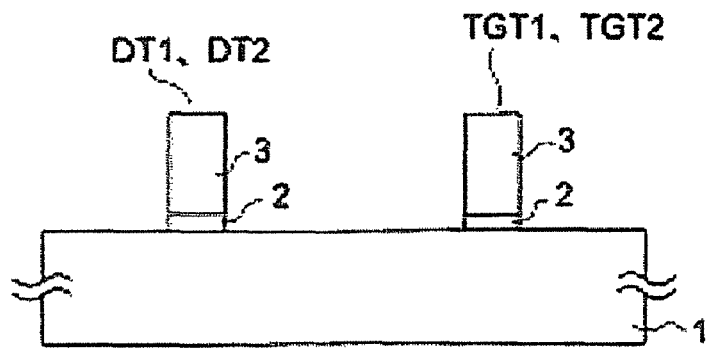
FIGS. 4A-5C is a cross sectional view showing a manufacturing process of a semiconductor device according to the first embodiment.

As shown in FIG. 4A, an unillustrated element isolation region is formed in the upper surface of the semiconductor substrate 1 in accordance with an ordinary CMOS process, and then a gate insulating film 2 and a gate electrode 3 made of polysilicon are formed in each of the element regions defined by the element isolation region.

Figure 4B:
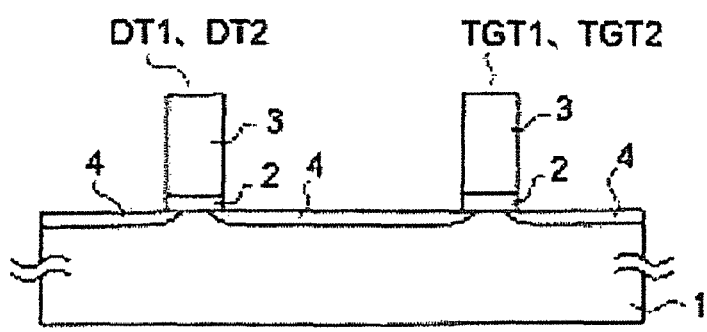

As shown in FIG. 4B, impurity ions are implanted into the semiconductor substrate 1 by using the gate electrodes 3 as a mask, and thereby a source extension 4 and a drain extension 4 are selectively formed in each of the driver transistors DT1 and DT2, the load transistors LT1 and LT2 and the transfer gate transistors TGT1 and TGT2.

Figure 4C:
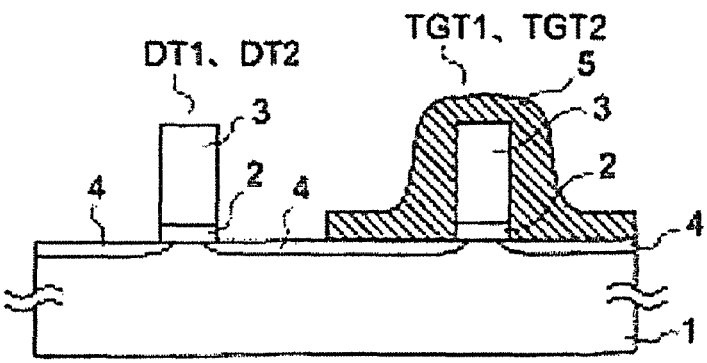

As shown in FIG. 4C, a silicon nitride (SiN) film 5 with a thickness of 40 nm is deposited on the entire upper surface of the semiconductor substrate 1, and then the silicon nitride (SiN) film 5 in regions including the driver transistors DT1 and DT2 and the load transistors LT1 and LT2 is selectively and isotropically etched off by a photolithography technique.

Figure 4D:
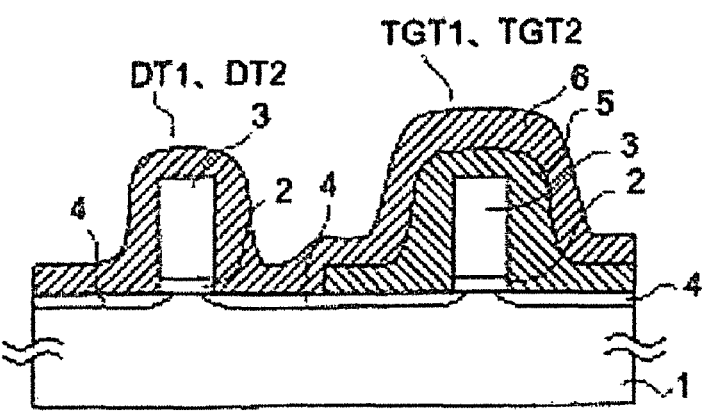
Figure 5A:
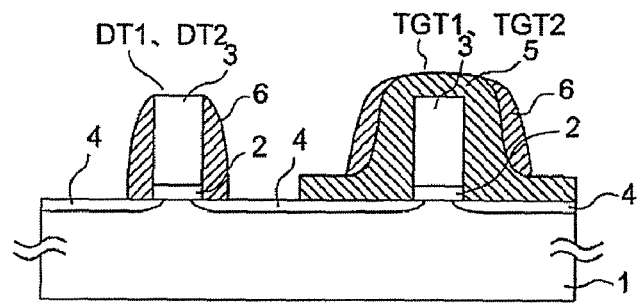

As shown in FIG. 4D, a hafnium oxide (HfO2) film 6 with a thickness of 40 nm is deposited on the entire upper surface of the semiconductor substrate 1. Thereafter, as shown in FIG. 5A, the hafnium oxide (HfO2) film 6 is anisotropically plasma etched, so that sidewalls 6 made of hafnium oxide (HfO2) are formed on the side surfaces of the gate insulating films 2 and the gate electrodes 3 of the driver transistors DT1 and DT2 and the load transistors LT1 and LT2.

Figure 5B:
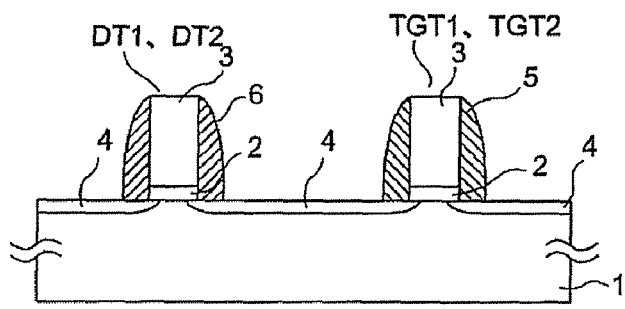

Then, the regions including the driver transistors DT1 and DT2 and the load transistors LT1 and LT2 are covered with a resist film, and the hafnium oxide (HfO2) film 6 in the other regions, which include the transfer gate transistors TGT1 and TGT2, are isotropically etched off. Thereafter, as shown in FIG. 5B, the silicon nitride (SiN) film 5 is anisotropically etched so that sidewalls 5 made of silicon nitride (SiN) can be formed on the side surfaces of the gate insulating films 2 and the gate electrodes 3 of the transfer gate transistors TGT1 and TGT2.

Figure 5C:
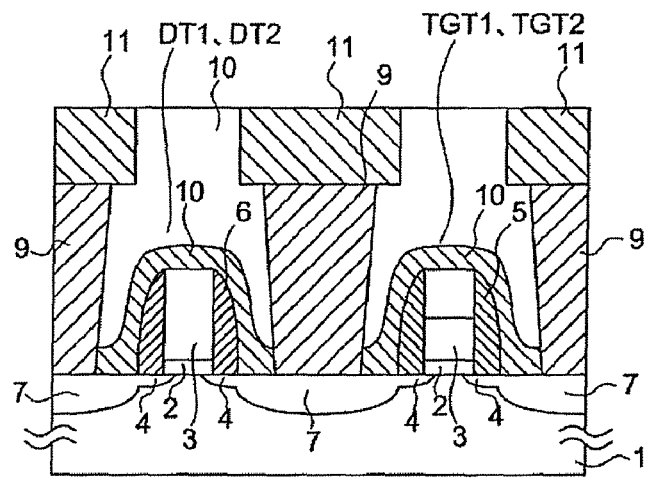

After that, as in the ordinary CMOS process, impurity ions are implanted into the semiconductor substrate 1 by using, as a mask, the gate electrodes 3, the sidewalls 6 and the sidewalls 5 as shown in FIG. 5C. Thereby, sources 7 and drains 7 deeper than the source extensions 4 and the drain extensions 4 are formed. Thereafter, a silicon nitride film 10 is formed to cover the gate electrodes 3 and the sidewalls 5 and 6, and a silicon dioxide film 10 is deposited thereon as an interlayer insulating film. Then, contact holes are formed such that the upper surfaces of the sources 7 and the drains 7 can be exposed, and then filled with contact plugs 9 made, for example, of tungsten. Thereafter, wiring layers 11 made, for example, of copper are formed to be connected to the contact plugs 9.

(2) Second Embodiment

Hereinafter, description will be given of a semiconductor device according to the second embodiment of the present invention. In the above first embodiment, the sidewalls of the load transistors LT1 and LT2 and the driver transistors DT1 and DT2 are made of a material with a higher dielectric constant than the sidewalls used in the transfer gate transistors TGT1 and TGT2.

In contrast, this second embodiment is characterized in that overlaps (facing areas) between each gate electrode and each source extension and between the gate electrode and each drain extension in the load transistors LT1 and LT2 and the driver transistors DT1 and DT2 are larger than those in the transfer gate transistors TGT1 and TGT2.

Figure 6A:
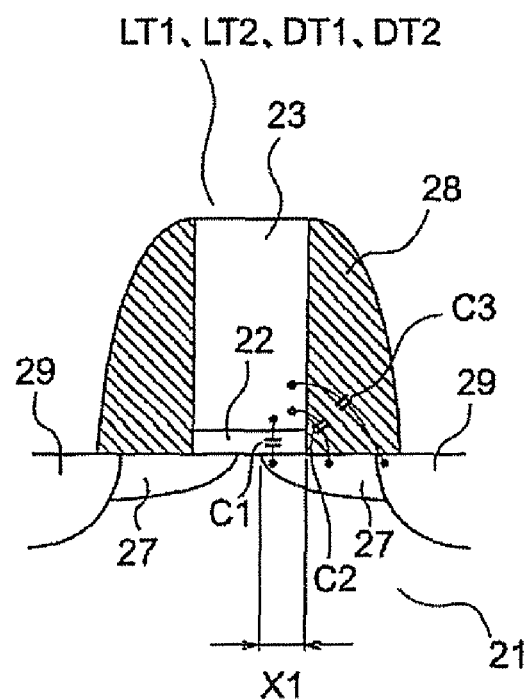
FIG. 6A is a cross sectional view of the load transistors LT1 and LT2 and the driver transistors DT1 and DT2 of a second embodiment.

As shown in FIG. 6A, for each of the driver transistors DT1 and DT2 and the load transistors LT1 and LT2, a gate insulating film 22 and a gate electrode 23 are formed on the upper surface of a semiconductor substrate 21, and, in addition, sidewalls 28 made of an insulating material are formed on the side surfaces of the gate insulating film 22 and the gate electrode 23. Then, impurity ions are implanted into the semiconductor substrate 21 by using the gate electrodes 23 as a mask, and thereby a source extension 27 and a drain extension 27 are formed. Additionally, impurity ions are implanted into the semiconductor substrate 21 by using the gate electrodes 23 and the sidewalls 28 as a mask, and thereby a source 29 and a drain 29 are formed.

Here, capacitance C1 exists between the gate electrode 23 and each of the source extension 27 and the drain extension 27 through the gate insulating film 22, while capacitance C2 exists between the gate electrode 23 and each of the source extension 27 and the drain extension 27 through the adjacent sidewall 28. In addition, capacitance C3 exists between the gate electrode 23 and each of the source 29 and the drain 29 through the adjacent sidewall 28.

Figure 6B:
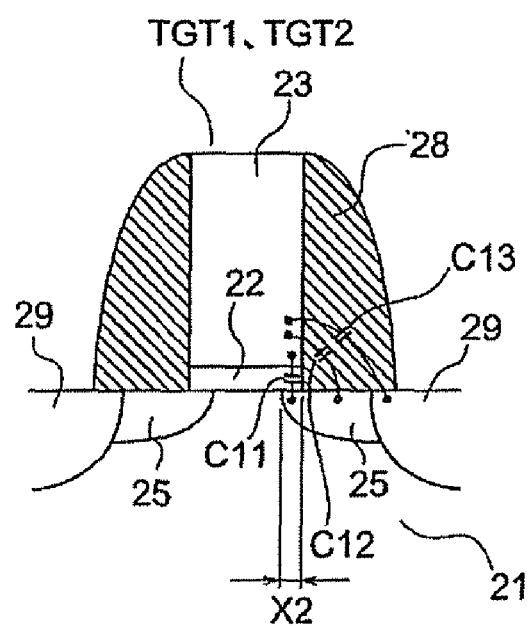
FIG. 6B is a cross sectional view of the transfer gate transistors TGT1 and TGT2 of a second embodiment.

Meanwhile, as shown in FIG. 6B, a gate insulating film 22, a gate electrode 23 and sidewalls 28 are formed for each transfer gate transistor. Then, impurity ions are implanted into the semiconductor substrate 21 by using the gate electrodes 23 as a mask, and thereby a source extension 25 and a drain extension 25 are formed. Additionally, impurity ions are implanted into the semiconductor substrate 21 by using the gate electrodes 23 and the sidewalls 28 as a mask, and thereby a source 29 and a drain 29 are formed.

Here, capacitance C11 exists between the gate electrode 23 and each of the source extension 25 and the drain extension 25 through the gate insulating film 22, while capacitance C12 exists between the gate electrode 23 and each of the source extension 25 and the drain extension 25 through the adjacent sidewall 28. In addition, capacitance C13 exists between the gate electrode 23 and each of the source 29 and the drain 29 through the adjacent sidewall 28.

The source extension 27 and the drain extension 27 in each of the load and driver transistors are formed so as to make an overlap with the gate electrode 23 larger than in each transfer gate transistor.

This makes the capacitance C1, parasitic between the gate electrode 23 and the source extension 27 and between the gate electrode 23 and the drain extension 27 through the gate insulating film 22 in each of the driver and load transistors, larger than the capacitance C11 in each transfer gate transistor. As a result, the semiconductor device according to this second embodiment can provide an operation stable to high-frequency signals.

Hereinafter, description will be given of a procedure of manufacturing the semiconductor device of this second embodiment with reference to FIGS. 7A to 8B. As in the above first embodiment, each of the cross-sectional views shown in FIGS. 7A to 8B also shows a longitudinal section taken along the line A-A in FIG. 3.

Here, as in the above first embodiment, the transistor in the left side is the driver transistor DT1 or DT2 while the transistor in the right side is the transfer gate transistor TGT1 or TGT2 in each of these drawings. The load transistor LT1 or LT2 is not shown since it has the same structure as the driver transistor DT1 or DT2 except for the conductivity types of the source and drain.

Figure 7A:
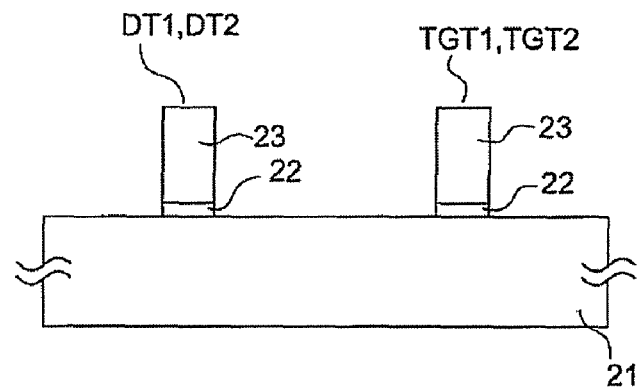
FIGS. 7A-8B is a cross sectional view showing a manufacturing process of a semiconductor device according to the second embodiment.

As shown in FIG. 7A, an unillustrated element isolation region is formed in the upper surface of the semiconductor substrate 21, and then a gate insulating film 22 and a gate electrode 23 are formed in each of the element regions defined by the element isolation region.

Figure 7B:
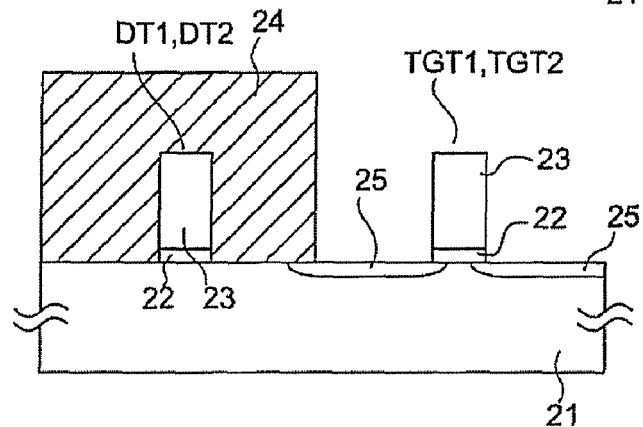

As shown in FIG. 7B, regions in which the driver transistors DT1 and DT2 and the unillustrated load transistors LT1 and LT2 are to be formed are masked with a resist film 24 while regions in which the transfer gate transistors TGT1 and TGT2 are to be formed are exposed. Then, arsine (As) ions are implanted into the latter regions at an accelerating voltage of 2 keV and with a dose amount of 1E15 cm-2 by using the gate electrodes 23 as a mask. Thereby, a source extension 25 and a drain extension 25 are formed not in each of the driver transistors DT1 and DT2 and the load transistors LT1 and LT2, but in each of the transfer gate transistors TGT1 and TGT2.

Figure 7C:
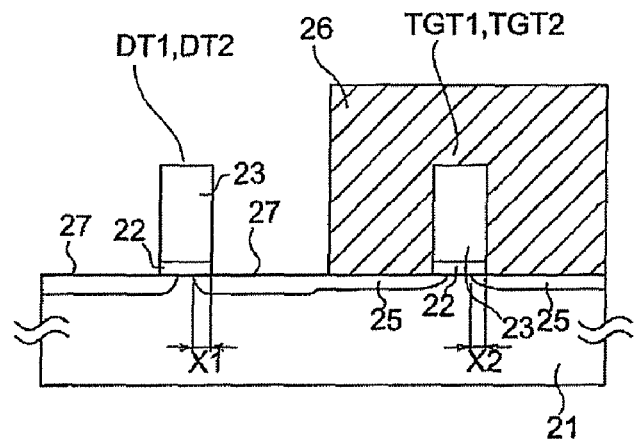

Then, as shown in FIG. 7C, the regions in which the transfer gate transistors TGT1 and TGT2 and the unillustrated load transistors LT1 and LT2 are to be formed are masked with a resist film 26 while regions in which the driver transistors DT1 and DT2 each configured of an N-channel MOS transistor are to be formed are exposed. Then, As ions are implanted into the latter regions at an accelerating voltage of 2 keV and with a dose amount of 1.3E15 cm-2 by using the gate electrodes 23 as a mask. Thereby, a source extension 27 and a drain extension 27 are formed in each of the driver transistors DT1 and DT2. The difference in conditions for the ion implantation makes the length X1 of each overlap in the driver transistors DT1 and DT2 longer than the length X2 of each overlap in the transfer gate transistors TGT1 and TGT2.

Figure 8A:
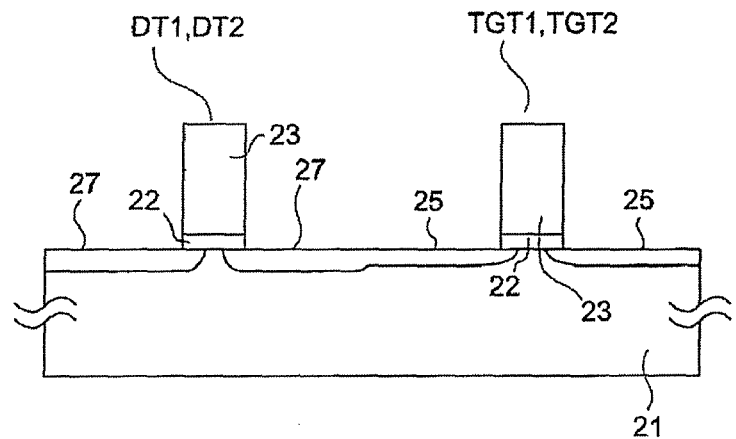

Then after the resist film 26 is peeled off as shown in FIG. 8A, an unillustrated resist film is formed such that the regions in which the load transistors LT1 and LT2 are to be formed can be exposed, and thereby a source extension and a drain extension are formed in each of the load transistors LT1 and LT2. As is the case with the aforementioned driver transistors DT1 and DT2, the length of each overlap in the load transistors LT1 and LT2 is also longer than the length of each overlap in the transfer gate transistors TGT1 and TGT2.

Figure 8B:
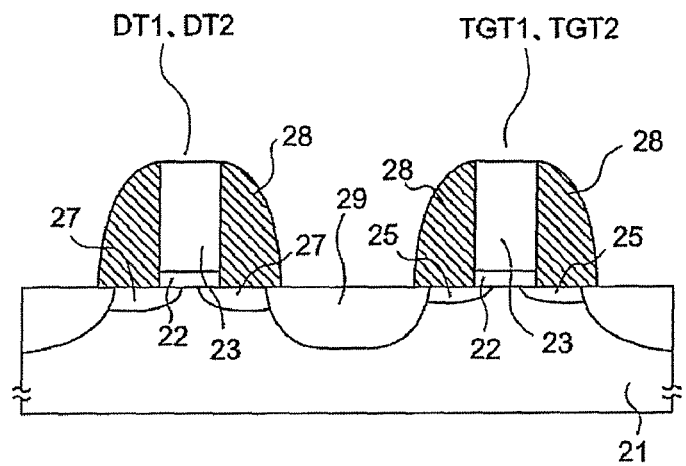

As shown in FIG. 8B, sidewalls 28 are formed on the side surfaces of the gate insulating film 22 and the gate electrode 23 by using, for example, silicon nitride (SiN). Thereafter, impurity ions are implanted into the semiconductor substrate 1 by using the gate electrodes 23 and the sidewalls 28 as a mask, and thereby a source diffusion layer and a drain diffusion layer are deeply formed in each of the load transistors LT1 and LT2 configured of a P-channel MOS transistor, the driver transistors DT1 and DT2 configured of an N-channel MOS transistor, and the transfer gate transistors TGT1 and TGT2.

Thereafter, as described in the above first embodiment, an interlayer insulating film is deposited, and contact holes, contact plugs and wiring layers are formed as in the ordinary CMOS process.

(3) Third Embodiment

Hereinafter, description will be given of a semiconductor device according to the third embodiment of the present invention by referring to the drawings.

Figure 9A:
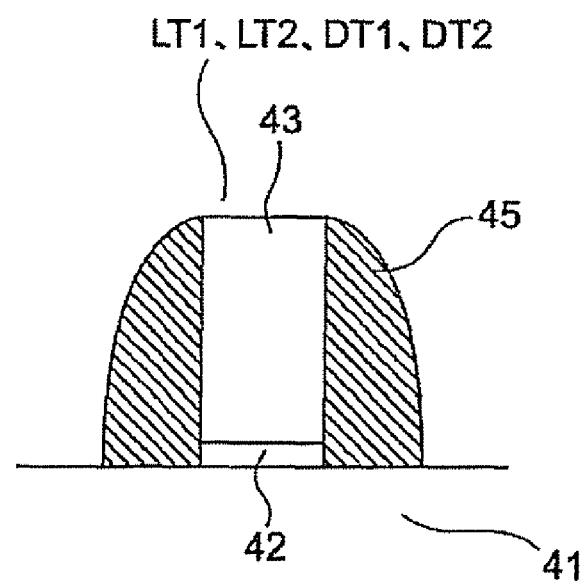
FIG. 9A is a cross sectional view of the load transistors LT1 and LT2 and the driver transistors DT1 and DT2 of a third embodiment.

In this third embodiment, as shown in FIG. 9A, in each of the load transistors LT1 and LT2 and the driver transistors DT1 and DT2 each including a gate insulating film 42 and a gate electrode 43 formed on a semiconductor substrate 41, sidewalls are formed on the side surfaces of the gate insulating film 42 and the gate electrode 43 by using only silicon nitride (SiN) films 45.

Figure 9B:
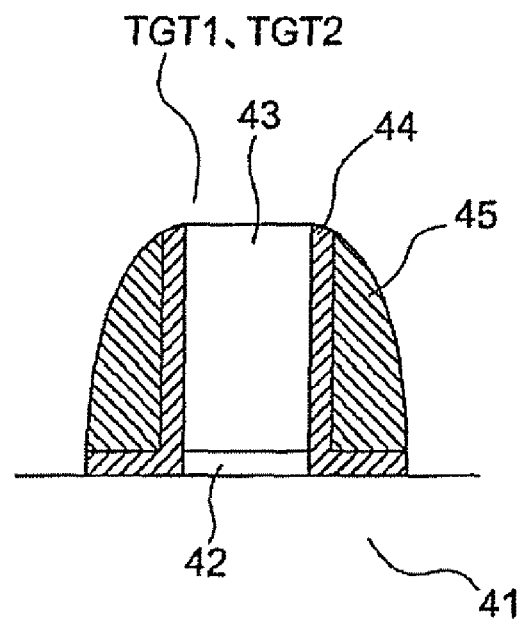
FIG. 9B is a cross sectional view of the transfer gate transistors TGT1 and TGT2 of a third embodiment.

Meanwhile, as show in FIG. 9B, sidewalls are formed on the side surfaces of a gate insulating film 42 and a gate electrode 43 in each of the transfer gate transistors TGT1 and TGT2 by using oxide silicon (SiO2) films 44 as inner layers of the sidewalls and silicon nitride (SiN) films 45 as outer layers thereof.

This makes overlap capacitance parasitic between the gate electrode 43 and the source and between the gate electrode 43 and the drain in each of the driver transistors DT1 and DT2 and the load transistors LT1 and LT2 larger than in each of the transfer gate transistors TGT1 and TGT2. As a result, the semiconductor device according to this third embodiment can provide an operation more stable to high-frequency signals.

Hereinafter, description will be given of a method of manufacturing the semiconductor device according to this third embodiment of the present invention with reference to FIGS. 10A to 11C. As in the above first and second embodiments, each of the cross-sectional views shown in FIGS. 10A to 11C also shows a longitudinal section taken along the line A-A in FIG. 3.

Here, as in the above first and second embodiments, the transistor in the left side is the driver transistor DT1 or DT2 while the transistor in the right side is the transfer gate transistor TGT1 or TGT2 in each of these drawings. The load transistor LT1 or LT2 is not shown since it has the same structure as the driver transistor DT1 or DT2 except for the conductivity types of the source and drain.

Figure 10A:
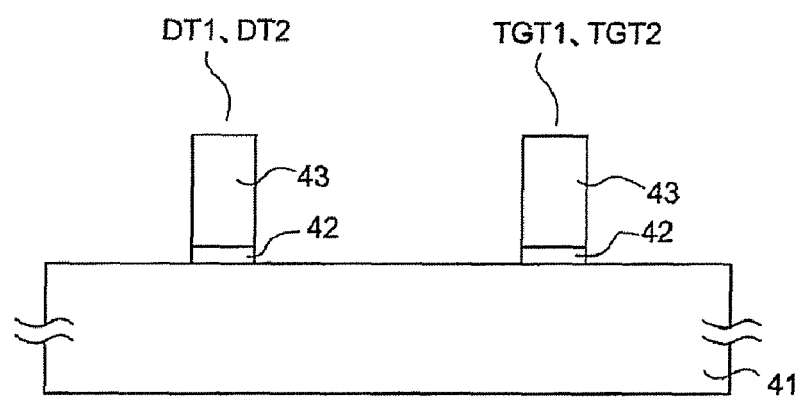
FIGS. 10A-11C is a cross sectional view showing a manufacturing process of a semiconductor device according to the third embodiment.

As shown in FIG. 10A, an unillustrated element isolation region is formed in the upper surface of the semiconductor substrate 41, and then a gate insulating film 42 and a gate electrode 43 are formed in each of the element regions defined by the element isolation region.

Figure 10B:
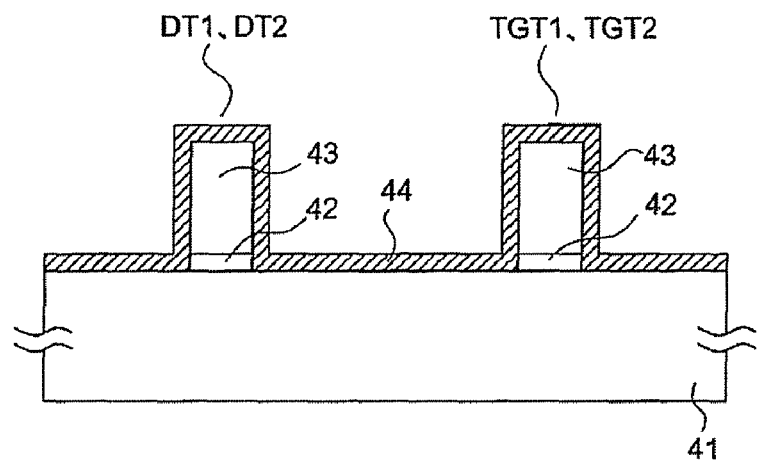

As shown in FIG. 10B, an oxide silicon (SiO2) film 44 with a thickness of 3 nm is deposited on the entire upper surface of the semiconductor substrate 1.

Figure 11A:
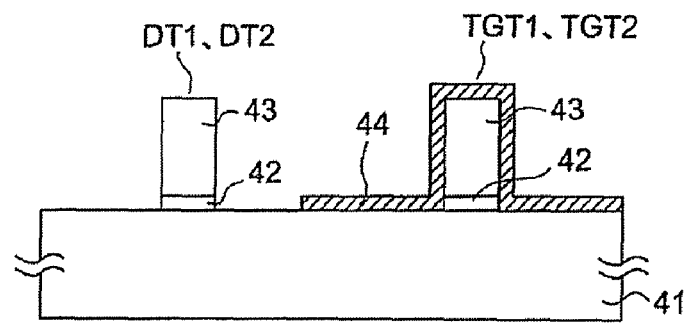
Figure 11B:
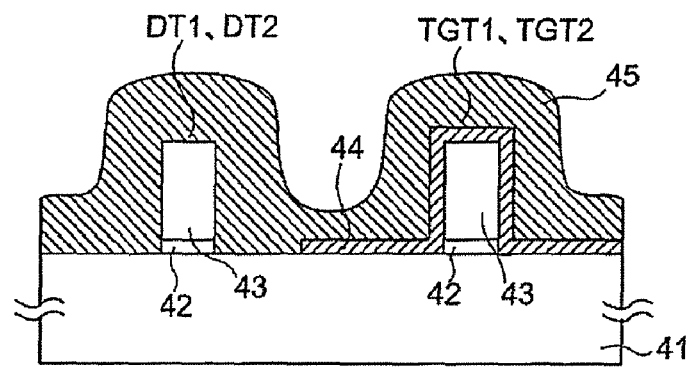

Then, as shown in FIG. 11A, the oxide silicon (SiO2) film 44 in regions including the load transistors LT1 and LT2 and the driver transistors DT1 and DT2 is selectively peeled off with a diluted hafnium (HF) solution by a photolithography technique. Thereafter, as shown in FIG. 11B, a silicon nitride (SiN) film 45 with a thickness of 70 nm is deposited on the entire upper surface of the semiconductor substrate 1.

Figure 11C:
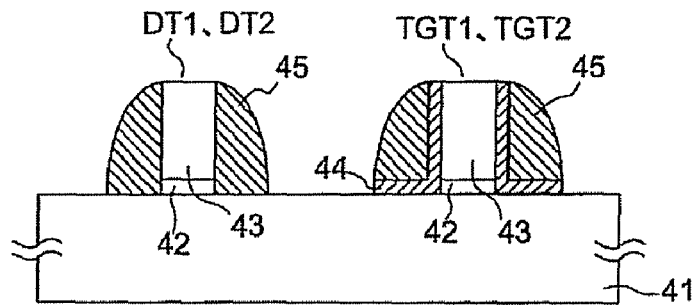

After that, as shown in FIG. 11C, the silicon nitride (SiN) film 45 and the oxide silicon (SiO2) film 44 are anisotropically etched back. Thereby, sidewalls made of the silicon nitride (SiN) film 45 are formed on the side surfaces of the gate insulating films 42 and the gate electrodes 43 of the load transistors LT1 and LT2 and the driver transistors DT1 and DT2, while sidewalls made of the L-shaped oxide silicon (SiO2) film 44 and the silicon nitride (SiN) film 45 are formed on the side surfaces of the gate insulating films 42 and the gate electrodes 43 of the transfer gate transistors TGT1 and TGT2.

In the semiconductor device with the above structure of this third embodiment, sidewalls made only of a silicon nitride (SiN), which has the higher dielectric constant, are formed in each of the load transistors LT1 and LT2 and the driver transistors DT1 and DT2. This allows the semiconductor device to provide an operation highly stable to high-frequency signals.

Note that each of the above embodiments is merely an example and thus does not limit the present invention. The above embodiments may be variously modified within the technical scope of the present invention.

For example, in the above first to third embodiments, each of the two types of the load transistors and the driver transistors has a structure with higher overlap capacitance than each transfer gate transistor. However, at least one type of the load transistors and the driver transistors needs to have a structure with a higher overlap capacitance than each transfer gate transistor.

Moreover, each SRAM cell of the above first to third embodiments has the transfer gate transistors TGT1 and TGT2 and the flip-flop consisting of the four transistors, that is, the load transistors LT1 and LT2 and the drive transistors DT1 and DT2 as shown in FIG. 1. In other words, each SRAM cell of the above embodiments includes six transistors in total. However, the total number of the transistors in each SRAM cell is not limited to six, but may be another number such as eight or ten. All that is required here is that the transistors constituting the flip-flop should have sidewalls with a higher dielectric constant.

Alternatively, each of the load transistors and the driver transistors may have a structure with a higher overlap capacitance than each transfer gate transistor by including the sidewalls formed thicker than the sidewalls of the transfer gate transistors.

Still alternatively, the above first to third embodiments may be combined. Specifically, a structure of the SRAM cell may be formed by combining any of the following conditions different between each transfer gate transistor and each of the load transistors and the driver transistors in terms of: a material for sidewalls, as in the first embodiment; a layer structure for sidewalls, as in the third embodiment; an overlap length between the gate electrode and each of the source extension and the drain extension, as in the second embodiment; and a sidewall thickness.

In the above first to third embodiments, only the transfer gate transistors in each SRAM cell are described as transistors different from the load transistors and the driver transistors in terms of a material and a structure of the sidewalls and an overlap length. However, transistors constituting a peripheral circuit other than the SRAM cells should be also different from the load transistors and the driver transistors in terms of a material and a structure of the sidewalls and an overlap length as well as the transfer gate transistors. This is because the overlap capacitance should be prevented from increasing in the transistors constituting the peripheral circuit as well.

Embodiments of the invention have been described with reference to the examples. However, the invention is not limited thereto.

Other embodiments of the present invention will be apparent to those skilled in the art from consideration of the specification and practice of the invention disclosed herein. It is intended that the specification and example embodiments be considered as exemplary only, with a true scope and spirit of the invention being indicated by the following.

What is claimed is:

1. A semiconductor device including a SRAM cell, comprising:
    a data holding unit including a driver transistor and a load transistor, and receiving and holding data; and
    a data transferring unit including a transfer gate transistor whose source and drain are connected between the data holding unit and one of a pair of bit lines, and whose gate is connected to a word line, the data transferring unit either transferring the data transferred from the one of the pair of bit lines to the data holding unit or receiving the data held in the data holding unit and transferring the data to the one of the pair of bit lines, wherein
    at least one of the driver transistor and the load transistor has higher capacitance between the gate and the source and between the gate and the drain than the transfer gate transistor.

2. The semiconductor device according to claim 1, wherein sidewalls of at least one of the driver transistor and the load transistor have a higher dielectric constant than sidewalls of the transfer gate transistor.

3. The semiconductor device according to claim 1, wherein the lengths of an overlap between a source extension and a gate electrode, and an overlap between a drain extension and the gate electrode in at least one of the driver transistor and the load transistor are longer than in the transfer gate transistor.

4. The semiconductor device according to claim 2, wherein the lengths of an overlap between a source extension and a gate electrode, and an overlap between a drain extension and the gate electrode in at least one of the driver transistor and the load transistor are longer than in the transfer gate transistor.

5. The semiconductor device according to claim 1, wherein sidewalls of at least one of the driver transistor and the load transistor are thicker than sidewalls of the transfer gate transistor.

6. The semiconductor device according to claim 2, wherein sidewalls of at least one of the driver transistor and the load transistor are thicker than sidewalls of the transfer gate transistor.

7. The semiconductor device according to claim 3, wherein sidewalls of at least one of the driver transistor and the load transistor are thicker than sidewalls of the transfer gate transistor.

8. The semiconductor device according to claim 1, wherein the sidewalls of at least one of the driver transistor and the load transistor contain at least one material selected from zirconium oxide ($ZrO_2$), hafnium oxide ($HfO_2$), aluminum oxide ($Al_2O_3$) and titanium oxide ($TiO_2$), and the sidewalls of the transfer gate transistor do not contain any of the materials.

9. The semiconductor device according to claim 2, wherein the sidewalls of at least one of the driver transistor and the load transistor contain at least one material selected from zirconium oxide ($ZrO_2$), hafnium oxide ($HfO_2$), aluminum oxide ($Al_2O_3$) and titanium oxide ($TiO_2$), and the sidewalls of the transfer gate transistor do not contain any of the materials.

10. The semiconductor device according to claim 1, wherein both of the driver transistor and the load transistor have higher capacitance between the gate and the source and between the gate and the drain than the transfer gate transistor.

11. The semiconductor device according to claim 1, wherein sidewalls of both of the driver transistor and the load transistor have a higher dielectric constant than sidewalls of the transfer gate transistor.

12. The semiconductor device according to claim 1, wherein the lengths of an overlap between a source extension and a gate electrode, and an overlap between a drain extension and the gate electrode in both of the driver transistor and the load transistor are longer than in the transfer gate transistor.

13. The semiconductor device according to claim 1, wherein sidewalls of both of the driver transistor and the load transistor are thicker than sidewalls of the transfer gate transistor.

14. The semiconductor device according to claim 10, wherein sidewalls of both of the driver transistor and the load transistor are thicker than sidewalls of the transfer gate transistor.

* * * * *